(12) United States Patent
Batarseh et al.

(10) Patent No.: US 7,583,128 B1
(45) Date of Patent: Sep. 1, 2009

(54) COMBINATION OF LINEAR AND ADAPTIVE NON-LINEAR CONTROL FOR FAST TRANSIENT RESPONSE

(75) Inventors: Issa Batarseh, Orlando, FL (US);
Xiangcheng Wang, Orlando, FL (US);
Shamala A. Chickamenahalli, Chandler, AZ (US); Edward R. Stanford, Olympia, WA (US)

(73) Assignee: University of Central Florida Research Foundation, Inc., Orlando, FL (US)

( * ) Notice: Subject to any disclaimer, the term of this patent is extended or adjusted under 35 U.S.C. 154(b) by 111 days.

(21) Appl. No.: 11/732,792

(22) Filed: Apr. 4, 2007

Related U.S. Application Data

(60) Provisional application No. 60/789,518, filed on Apr. 5, 2006.

(51) Int. Cl.
*H03K 17/16* (2006.01)
*H03K 17/30* (2006.01)
(52) U.S. Cl. ...................... 327/381; 327/379
(58) Field of Classification Search ............. 327/381, 327/379
See application file for complete search history.

(56) References Cited

U.S. PATENT DOCUMENTS

| | | | |
|---|---|---|---|
| 6,628,106 B1 | 9/2003 | Batarseh et al. | 323/222 |
| 6,798,180 B2* | 9/2004 | Sase et al. | 323/282 |
| 6,906,931 B1 | 6/2005 | Batarseh et al. | 363/17 |
| 6,982,887 B2 | 1/2006 | Batarseh et al. | 363/89 |
| 7,034,511 B2* | 4/2006 | Schuellein et al. | 323/272 |
| 7,149,096 B2 | 12/2006 | Batarseh et al. | 363/16 |

* cited by examiner

*Primary Examiner*—Lincoln Donovan
*Assistant Examiner*—John W Poos
(74) *Attorney, Agent, or Firm*—Brian S. Steinberger; Phyllis K. Wood; Law Offices of Brian S. Steinberger, P.A.

(57) ABSTRACT

Methods, systems and apparatus for a controller for fast transient response, the controller including a linear compensation circuit for controlling output voltage during steady state operation and a non-linear control circuit to generate a non-linear signal during transient periods, only a first pulse of the non-linear signal is injected during each transient period. The combination linear and non-linear control provides stability and reduces delay times for fast transient response. The non-linear control circuit includes a step up and a step down non-linear control circuit for producing the non-linear signal with a short delay time when the load voltage is less or greater than the reference voltage. An embodiment includes an adaptive circuit or generating a current signal dependent on the load current, the current signal is combined with the output voltage to reduce the difference between the reference and output voltages.

15 Claims, 13 Drawing Sheets

COMBINATION OF LINEAR AND ADAPTIVE NON-LINEAR CONTROL FOR FAST TRANSIENT RESPONSE

This application claims the benefit of priority to U.S. Provisional Patent Application No. 60/789,518 filed on Apr. 5, 2006.

FIELD OF THE INVENTION

This invention relates to controllers for fast transient response and, in particular, to methods, systems, apparatus and devices for a combination linear and adaptive non-linear control for fast transient response for high current slew rate, high power density and high efficiency isolated or non-isolated dc-dc converter.

BACKGROUND AND PRIOR ART

The converter transient response is mainly limited by filter inductance, dv/dt and delay time of the error amplifier (EA) compensation network. High switching frequency operation helps to reduce the filter inductance, but it deteriorates the converter efficiency. Design of the compensation network to minimize the delay time of the compensation network is very important to the transient response under certain switching frequency. The longer delay time the compensation network has, the worse transient response or voltage spikes occur.

Adequate gain and phase margins are required in the conventional linear control for the converter stability. In transient periods, in ideal case, the error amplifier output (EAO) increases in step up load and decrease in step down immediately following the transient load, so there are no voltage spikes in the output voltage. Actually, the EAO is determined by error amplifier performance and the design of the compensation network, if it cannot change as quickly as the load, and then the output voltage spikes occur. Smaller gain and phase margins contribute to smaller delay time and faster transient response, at the sacrifices of converter stability. Thus, there is a trade-off between the transient response and converter stability when designing the converter. Usually high performance and costly error amplifiers such as high product of gain and bandwidth, high dv/dt, is used to reduce the delay time for fast transient response.

Hysteretic control has very small delay time because it has no compensation network and the delay time is only determined by the performance of the comparator. Hysteretic control is carried out by comparing the feedback voltage signal and reference voltage with a hysteretic window. When output voltage is larger than the lower reference voltage, it outputs high level drive signal, and vice versa, low level or no drive signal is generated. The main disadvantage of hysteretic control is the variable switching frequency related with the hysteretic window, the variable switching frequency makes it difficult to design the converter filter. At the same time the parasitic resistance and inductance of printed circuit board traces, output capacitors and connectors strongly affect the functions of hysteretic control, and it is very sensitive to the noises. As a result, the hysteretic control is very difficult for high slew rate applications.

Active voltage positioning is another method used for fast transient response, which means the dc output voltage of the converter is dependent on the load current. The output voltage is set to the highest level at no-load condition and to the lowest level at full load. This approach increases the output voltage transient tolerance as much as twofold in the voltage regulator. Active voltage position can achieve almost dc constant output impedance of the converter. Active voltage position method is an improved linear control. In transient periods, the delay time of the compensation network still introduces voltage spikes and it is impossible to eliminate the delay time because of the requirement of the converter stability.

With the increasing demand for better dynamic performance under high slew rate output current, smaller delay times in a linear controller are required to improve the transient response. What is needed is a combination of linear and adaptive non-linear control to reduce the delay times for fast transient response, and it simplifies linear controller design.

SUMMARY OF THE INVENTION

A primary objective of the invention is to provide apparatus, methods, systems and devices for a combination of linear and adaptive non-linear control to reduce the delay times for fast transient response.

A secondary objective of the invention is to provide apparatus, methods, systems and devices for a combination linear and adaptive non-linear control for fast transient response for high current slew rate, high power density and high efficiency isolated or non-isolated dc-dc converter.

A third objective of the invention is to provide apparatus, methods, systems and devices for a combination of linear and adaptive non-linear control to reduce the delay times for fast transient response that simplifies the design the linear compensation network for converter stability and the non-linear control handles the transient response.

A first preferred embodiment of the invention provides a controller for fast transient response. The controller includes a linear compensation circuit for controlling a output voltage during steady state operation and a non-linear control circuit connected in parallel with the linear compensation circuit for comparing a load voltage to a reference voltage to generate a non-linear signal during transient periods, only a first pulse of the non-linear signal is injected during each transient period, wherein the combination linear and non-linear control provides stability and reduces delay times for fast transient response. The non-linear control circuit includes a step up non-linear control circuit for producing a step up non-linear signal with a short delay time when the load voltage is less than a step up reference voltage during step up load and a step down non-linear control circuit for producing a step down non-linear signal with a short delay time when the load voltage is greater than a step down reference voltage during step down load.

In another embodiment, the controller includes an adaptive circuit connected with an input of the non-linear control circuit for receiving a load current and generating a current signal dependent on the load current, wherein the current signal is combined with the output voltage to further reduce a difference between the reference voltage and the output voltage input into the non-linear control circuit.

A second preferred embodiment provides a method for fast transient response during transient periods including receiving a load voltage, generating a linear output during steady state operation for stability, comparing the load voltage to a reference voltage to detect a transient period, and generating a non-linear output signal during the detected transient period transient operation, wherein the combination linear and non-linear control provides stability and reduces delay times for fast transient response.

Further objects and advantages of this invention will be apparent from the following detailed description of preferred embodiments which are illustrated schematically in the accompanying drawings.

BRIEF DESCRIPTION OF THE FIGS.

DESCRIPTION OF THE PREFERRED EMBODIMENTS

Figure 1:
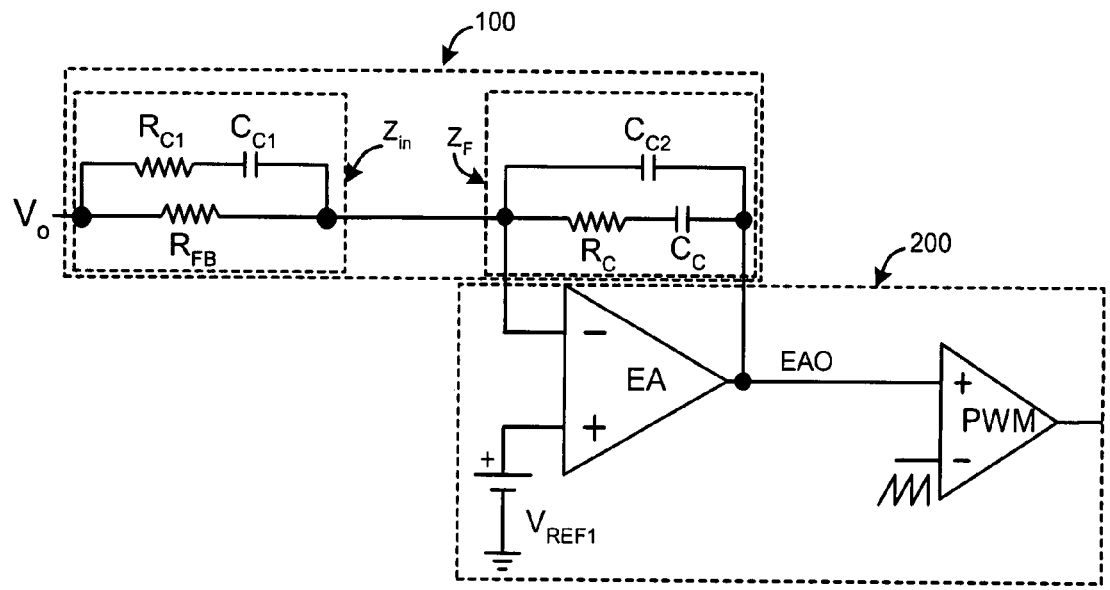
FIG. 1 is a schematic of a prior art conventional linear control block diagram.

Before explaining the disclosed embodiments of the present invention in detail it is to be understood that the invention is not limited in its application to the details of the particular arrangements shown since the invention is capable of other embodiments. Also, the terminology used herein is for the purpose of description and not of limitation.

The following is a list of the reference numbers used in the drawings and the detailed specification to identify components:

| | |
|---|---|
| 100 | linear control compensation network |
| 200 | error amplifier and PWM controller |
| 300 | non-linear control circuit |
| 310 | step up non-linear controller |
| 320 | step down non-linear controller |
| 400 | adaptive circuit for non-linear control |
| 500 | step up controller for ATVC |
| 501 | step down controller ATVC |
| 610 | transient current waveform |
| 611 | max. current |
| 612 | min. current |
| 620 | output voltage waveform |
| 621 | steady state voltage |
| 622 | min. voltage step up load |
| 623 | reference voltage $V_{R12}$ |
| 624 | reference voltage $V_{R22}$ |
| 625 | max. voltage step down load |
| 626 | reference voltage $V_{R11}$ |
| 627 | reference voltage $V_{R21}$ |
| 630 | non-linear control waveform |
| 631 | non-linear control waveform $V_{NL1}$ in step up load |
| 632 | non-linear control waveform $V_{NL2}$ in step down load |
| 640 | error amplifier output |
| 650 | converter duty cycle |
| 651 | full converter duty cycle |
| 652 | zero converter duty cycle |

This invention relates to controllers for dc-dc converter and, in particular, to methods, systems, apparatus and devices for a high current slew rate, high power density and high efficiency isolated or non-isolated dc-dc converter. The converter transient response is mainly determined by the filter inductance, dv/dt and delay time of error amplifier (EA) compensation network. The filter inductance is always designed by the switching frequency and its related power losses. With the increasing demand for better dynamic performance under high slew rate output current, smaller delay time of EA compensation network is required to improve the transient response. A combination of linear and adaptive non-linear control is used to reduce the delay time of compensation network for fast transient response with common requirement of EA.

Figure 2:
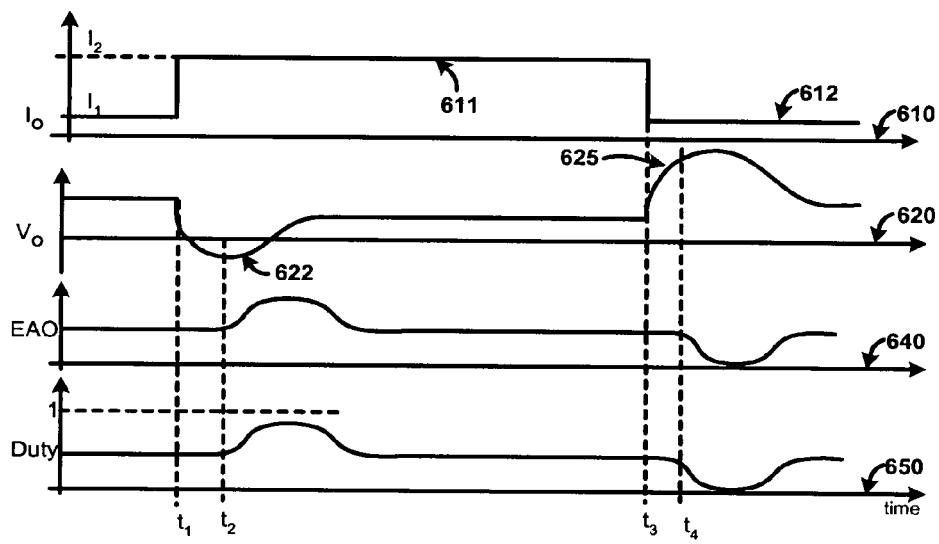
FIG. 2 shows conventional linear control transient waveforms corresponding to the schematic of FIG. 1.

FIG. 1 and FIG. 2 show conventional linear control block diagram and its main transient waveforms. As is well known in the art, the error amplifier is used to compensate the gain and phase margins for the converter stability by the feedback impedance $Z_F$ and the input impedance $Z_{in}$ in compensation network 100, and then error amplifier output (EAO) compares with saw tooth waveform in pulse width modulation (PWM) controller 200 to generate duty cycle for the converter. When the output voltage $V_o$ is larger than reference voltage $V_{REF1}$, the error amplifier output EAO decreases to reduce the width of the duty cycle, when the output voltage is less than reference $V_{REF1}$, the EAO increases to enlarge the duty cycle, finally, the converter is regulated for constant voltage output.

In step up load shown in FIG. 2, the output current $I_o$ 610 changes from 612 to 611, the EAO 640 and duty cycle 650 does not immediately catch up with load change. A voltage drop 622 occurs because of the delay time $t_{21}$ of the EAO and duty cycle, and vice versa, an over voltage spike 625 in step down load due to the delay time $t_{43}$, shown in FIG. 2. The delay time of linear control is impossible to eliminate because adequate gain and phase margins are required for converter stability. Reducing the delay time is very important, especially for fast transient response and converter stability.

Figure 3:
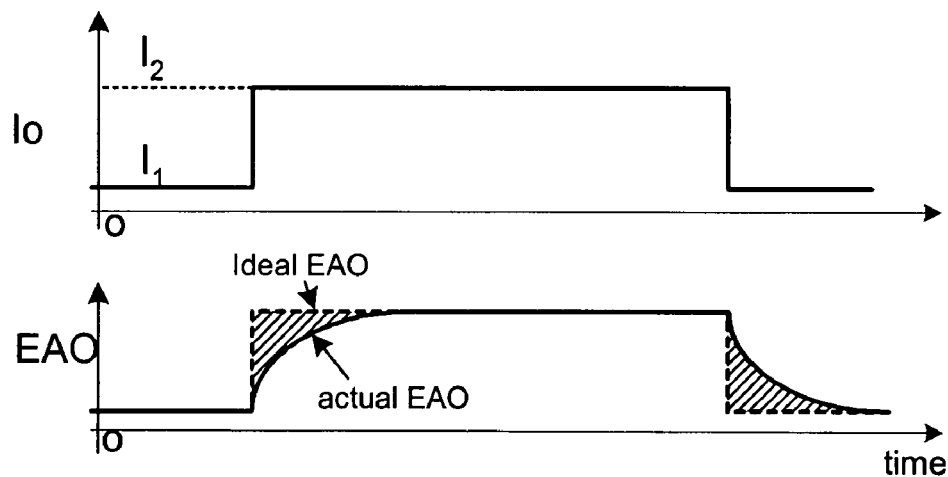
FIG. 3 shows error amplifier output comparisons in transient current waveforms for to ideal and actual cases.

FIG. 3 shows the error amplifier output comparison of the ideal and actual case in transient current. The ideal error amplifier output EAO changes immediately with the transient load change, so there will be no transient voltage spikes. The actual EAO rises slowly because of the compensation network and the performance of the error amplifier. The shadowed area EAO difference between ideal and actual determines the transient voltage spikes. The larger the shadowed areas in step up and step down loads, the higher the transient voltage spikes that occur in transient load.

Figure 4:
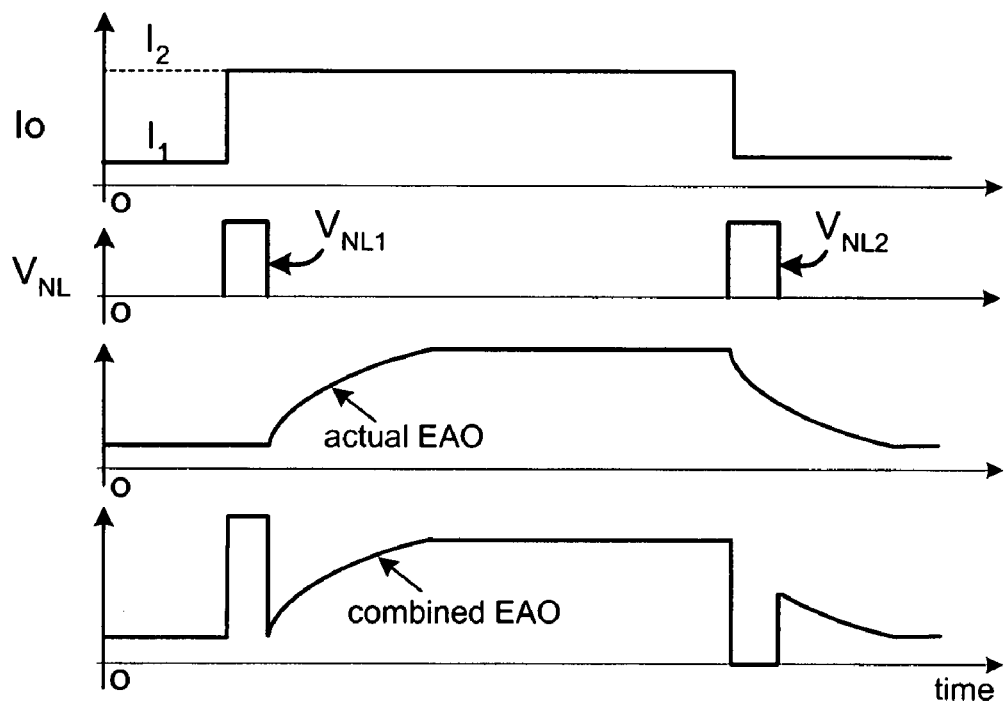
FIG. 4 are waveforms showing combined linear and non-linear control used to reduce the delay time for fast transient response.

The apparatus, methods, systems and devices of the present invention reduce the delay time for fast transient response using the combination of linear and non-linear control. The waveforms shown in FIG. 4 show the principle of the combination of linear and non-linear control for fast transient response. Non-linear control is activated only in transient periods, and generates $V_{NL1}$ in step up load and $V_{NL2}$ in step down load with very small delay time using simple comparators with hysteretic window. Only the first pulse of the output of non-linear control $V_{NL}$ is used to sum with the actual EAO of the linear control. The area of the first pulse $V_{NL1}$ of the output of non-linear control approximates the shadowed area between the ideal EAO and actual EAO in step up load shown in FIG. 3. Similarly for $V_{NL2}$ in the step down load, then the combined EAO of linear and non-linear control is close to ideal EAO, resulting in very small delay time and small transient voltage spikes. Most importantly, there is no stability problem for non-linear control because only a one pulse non-linear control signal is injected. In steady state, only the actual EAO of the linear control determines the converter duty cycle and the non-linear control is in standby.

Figure 5:
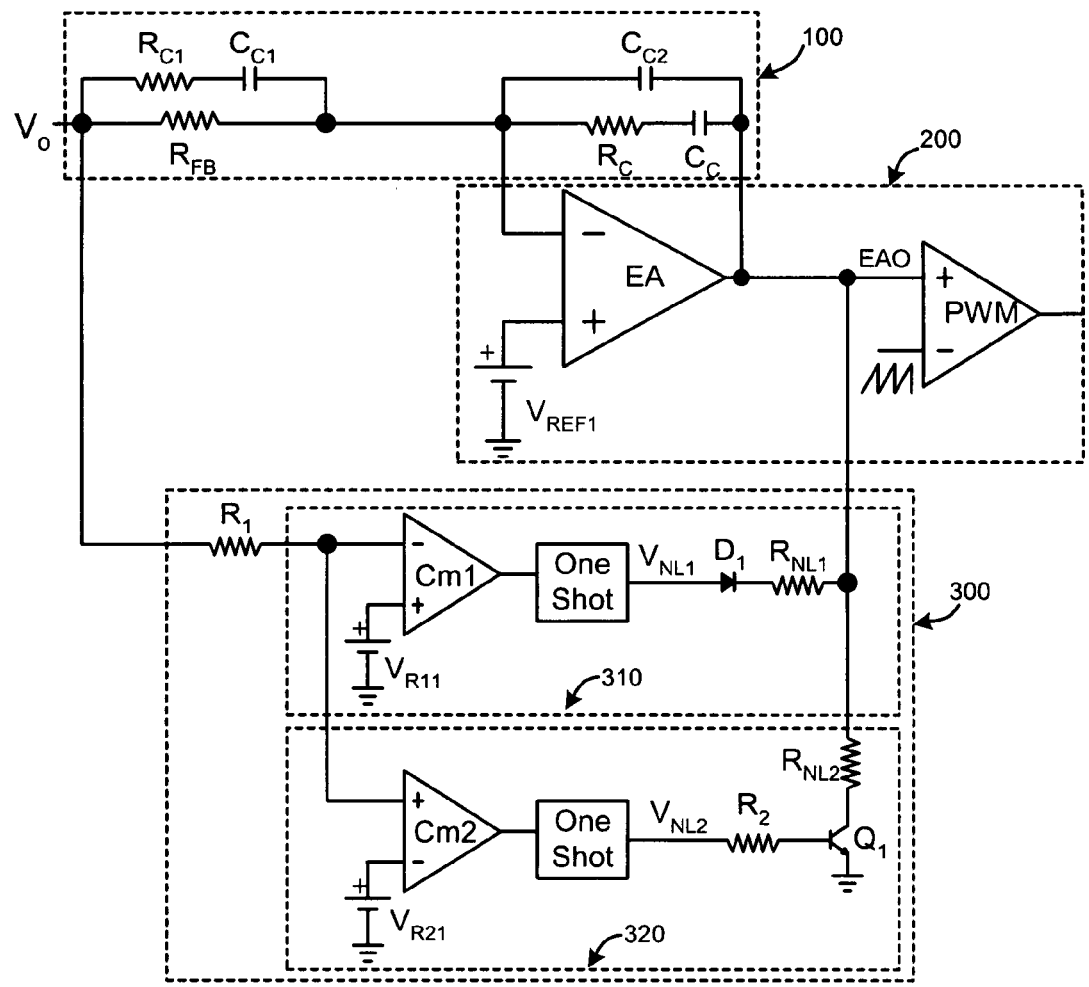
FIG. 5 is a schematic diagram of a combination of linear and non-linear control according to the present invention.

The delay time of the combination of linear and non-linear control is largely reduced compared with conventional linear control. It also simplifies the design of the linear compensation network for converter stability and the non-linear control handles the transient response. FIG. 5 shows the implementation circuit of the combination of linear and non-linear control. Non-linear control circuit 300 is composed of two parts 310 for the step up load and 320 for step down load. The waveforms shown in FIG. 6 correspond to the circuit shown in FIG. 5. In the step up load, the non-linear output voltage $V_{NL1}$ 631 of comparator Cm1 is summed with the output of linear control by the one-shot circuit, diode $D_1$ and $R_{NL1}$ when the output voltage $V_o$ is less than the reference voltage $V_{R11}$ 626, and then the duty cycle 650 becomes full duty cycle 651 after very small delay time between $t_{21}$ and $t_{11}$ so that the converter can supply the current as quick as possible to the load. In step down load, $V_{NL2}$ 632 is subtracted from the output of linear control by comparator Cm2, one-shot circuit, $R_2$, $Q_1$ and $R_{NL2}$ when the output voltage $V_o$ is larger than reference voltage $V_{R21}$ 627, the EAO decreases to zero after very small delay time between $t_{41}$ and $t_{31}$, and then there is zero duty cycle 652. As a result, the combination of linear and non-linear control reduces the transient voltage spike by reducing the response time in transient current.

The one shot circuit is used so that only the first pulse of the output of non-linear control combines with the output of linear control so that no stability problem occurs in non-linear control. With the combination of linear and non-linear control, the transient output voltage spike can be reduced in step up load and step down load as shown by the waveforms in FIG. 6.

Figure 6:
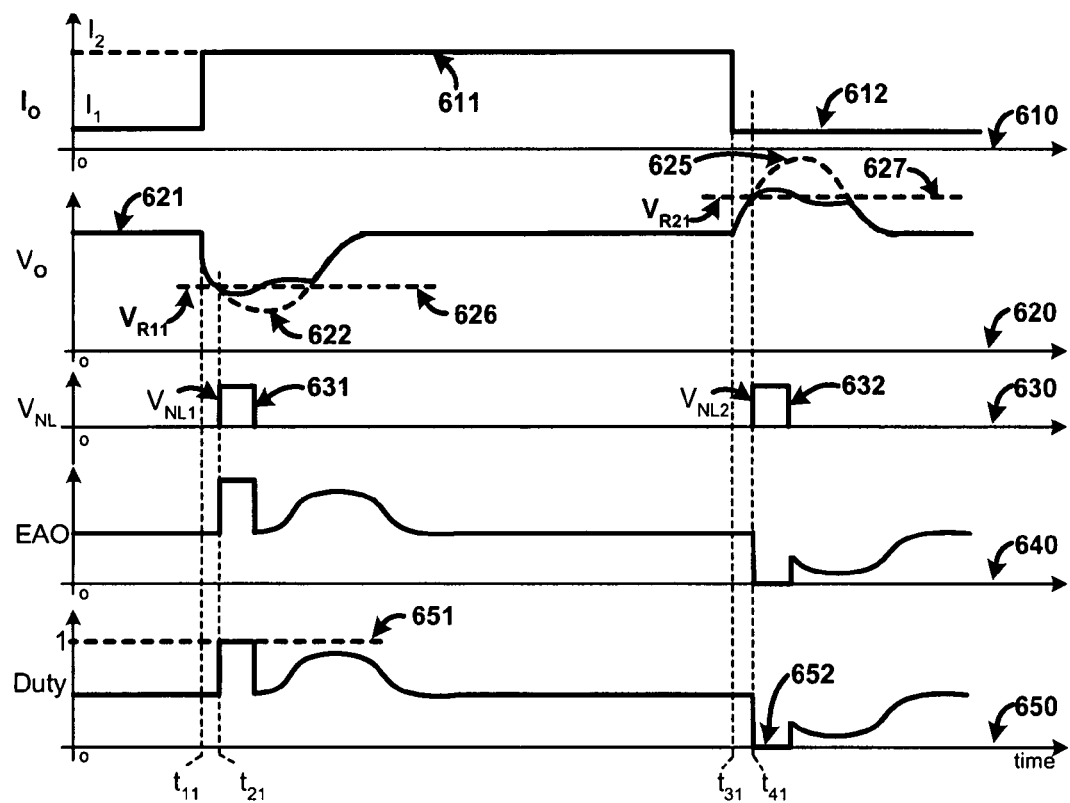
FIG. 6 shows the key waveforms for the combination of linear and non-linear control circuit shown in FIG. 5.

Referring to FIG. 6, $V_{R11}$ 626 is the constant reference voltage of comparator Cm1 in step up load, which is lower than steady state output voltage 621 and $V_{R21}$ 627 is the constant reference voltage of comparator Cm2 in step down load in non-linear control, which is higher than steady state output voltage 621. Output voltage 622 is the lowest voltage drop in step up load and 625 is the highest voltage overshoot in step down load with conventional linear control.

Figure 7:
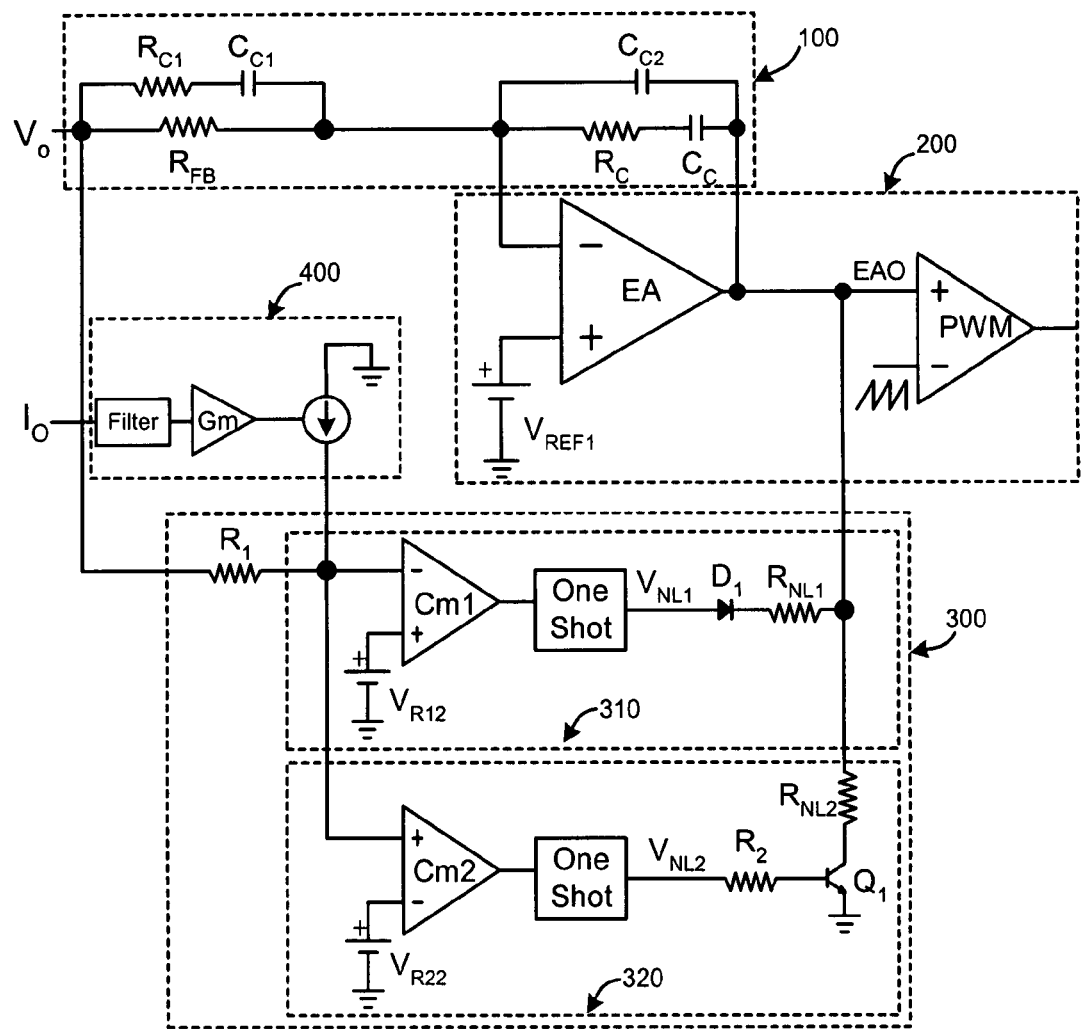
FIG. 7 is a schematic diagram of another combination of linear and adaptive non-linear control according to the present invention.
Figure 8:
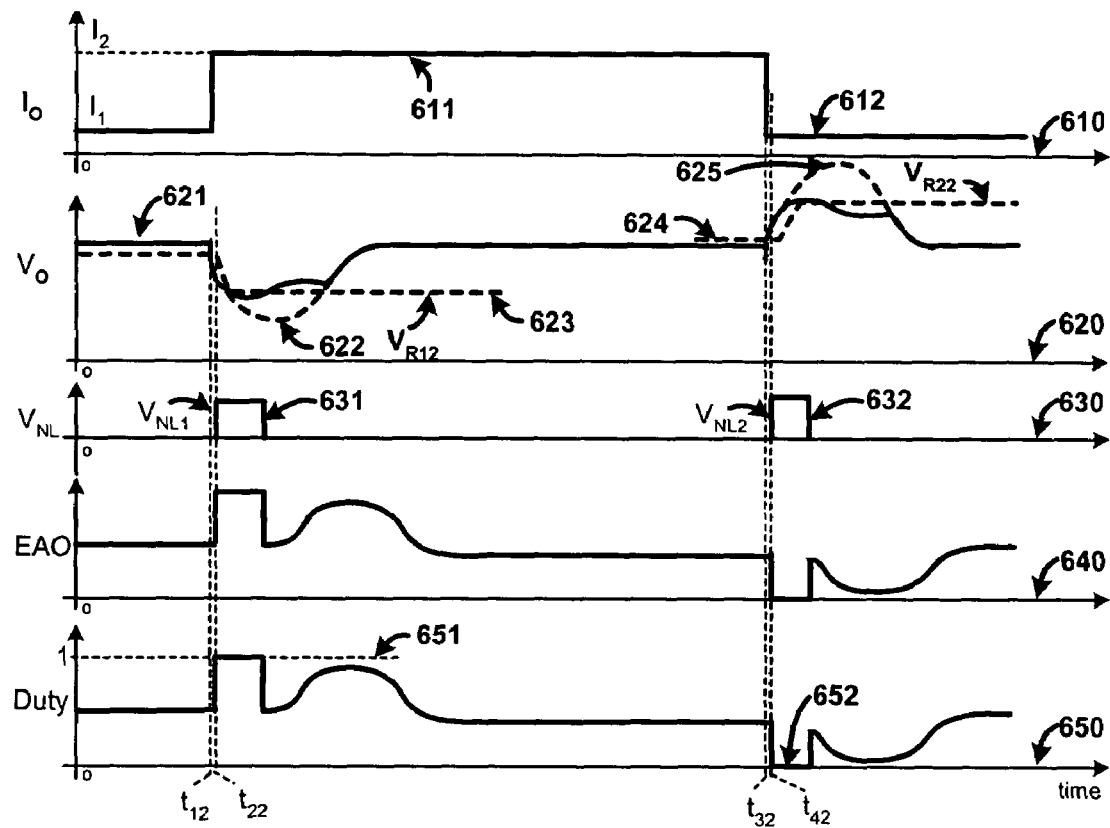
FIG. 8 shows waveforms corresponding to the combination of linear and adaptive non-linear control circuit shown in FIG. 7.

In FIG. 6, the delay time of combination of linear and non-linear control is $t_{21}$-$t_{11}$ in step up load and $t_{41}$-$t_{31}$ in step down load, which is primarily determined by the performance of comparators and the voltage difference between the output voltage $V_o$ and the reference voltage $V_{R12}$ and $V_{R22}$, respectively. The decreased difference between reference voltage and the output voltage is in comparators, the smaller delay time for the non-linear control has. To further reduce the delay time is to reduce the voltage difference between output voltage and reference voltage in the comparators. FIG. 7 is a schematic diagram of the combination of linear and adaptive non-linear control for fast transient response according to the present invention. The waveforms corresponding to the circuit diagram shown in FIG. 7 are shown in FIG. 8.

Referring to FIG. 7, adaptive non-linear control is accomplished by the circuit 400, which is composed of a filter, a transconductance amplifier Gm and a controlled current source. Referring to graph 620 in FIG. 8, 623 is the reference voltage $V_{R12}$ of comparator Cm1 in combination of linear and non-linear control and 624 is the reference voltage $V_{R22}$ of comparator Cm2 in the combination of linear and non-linear control. The comparator reference voltages $V_{R12}$ 623 in step up load is lower than steady state voltage 621 and reference voltage $V_{R22}$ 624 in step down load is higher than steady state voltage 621 in adaptive non-linear control are shown in dash line in FIG. 8, which are dependent on the load current. With the introduction of a current signal, the voltage difference of comparator is reduced largely and then the delay time of non-linear control is reduced from $t_{21}$-$t_{11}$ (FIG. 6) to $t_{22}$-$t_{12}$ (FIG. 8) in step up load and from $t_{41}$-$t_{31}$ (FIG. 6) to $t_{42}$ to $t_{32}$ (FIG. 8) in step down load. As shown, the combination of linear and adaptive non-linear control according to the preferred embodiment of the present invention further reduces the transient voltage spikes.

Figure 9:
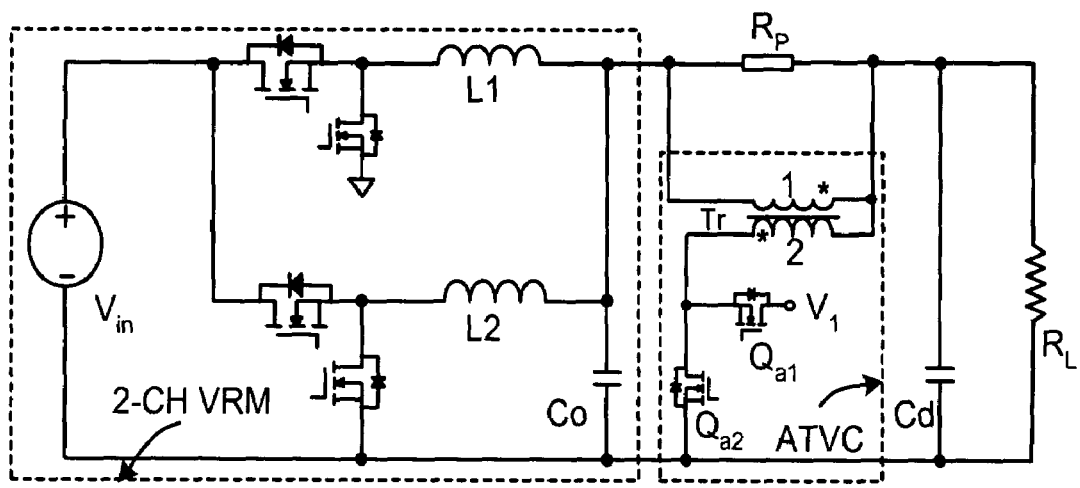
FIG. 9 is a schematic diagram of an experimental circuit used to verify combined linear and adaptive non-linear control.
Figure 10:
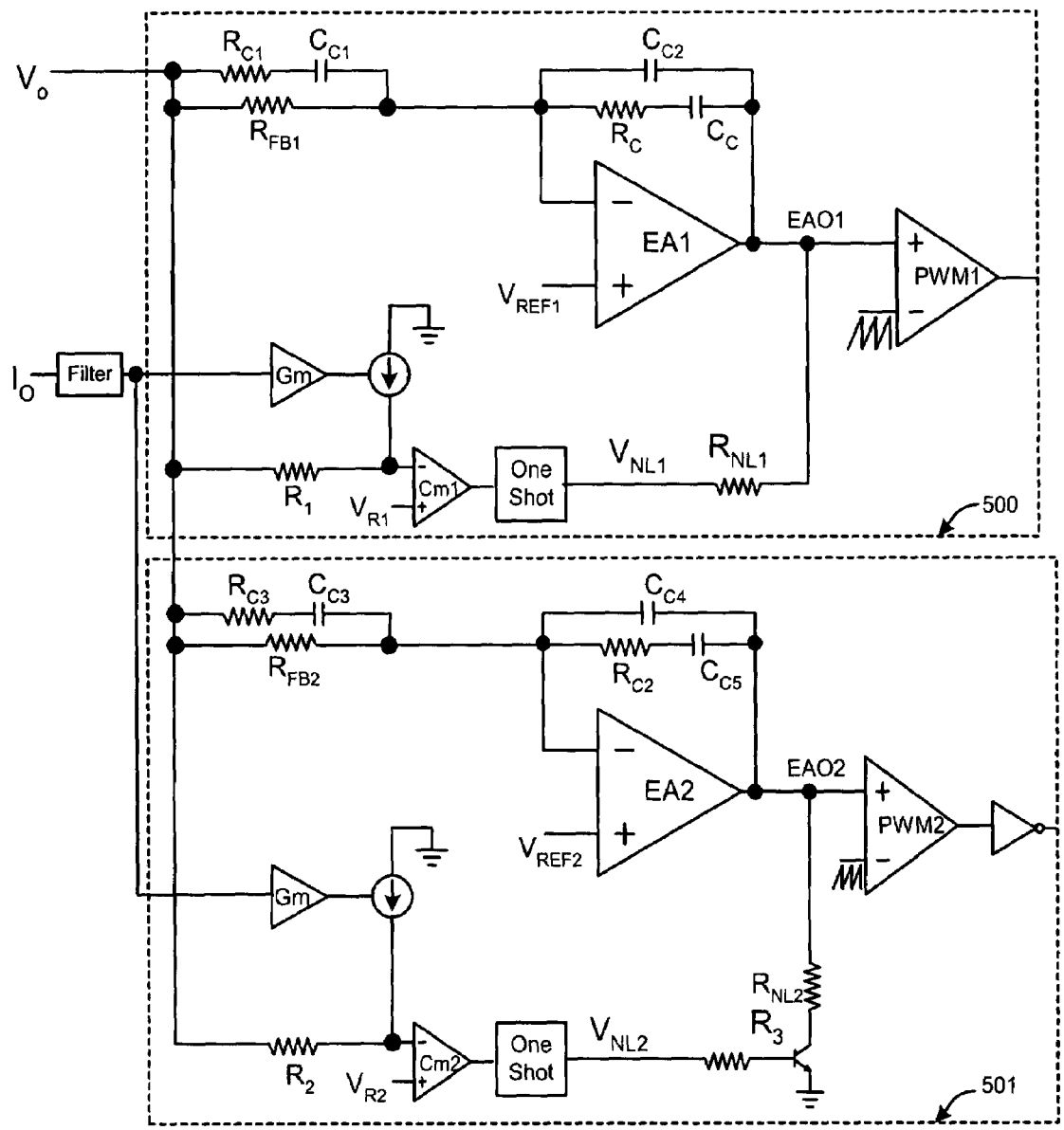
FIG. 10 is a schematic of a combined linear and adaptive non-linear control circuit for the active transient voltage compensator to improve the transient response.

FIG. 9 shows the experimental circuit, including 2-CH voltage regulator at 2.2 µH filter inductance, approximately 300 kHz switching frequency, output voltage 1.5V/30 A, and an active transient voltage compensator at 1.5 MHz, 2:1 turn ratio with ER11 core. The controller of active transient voltage compensator is composed of linear and adaptive non-linear control shown in FIG. 10. Vga1 is the drive signal of $Q_{a1}$ and $V_{ga2}$ is the drive signal of $Q_{a2}$ in active transient voltage compensator. $V_{NL1}$ is the non-linear control signal in step up load and $V_{NL2}$ is the non-linear control signal in step down load.

Figure 11:
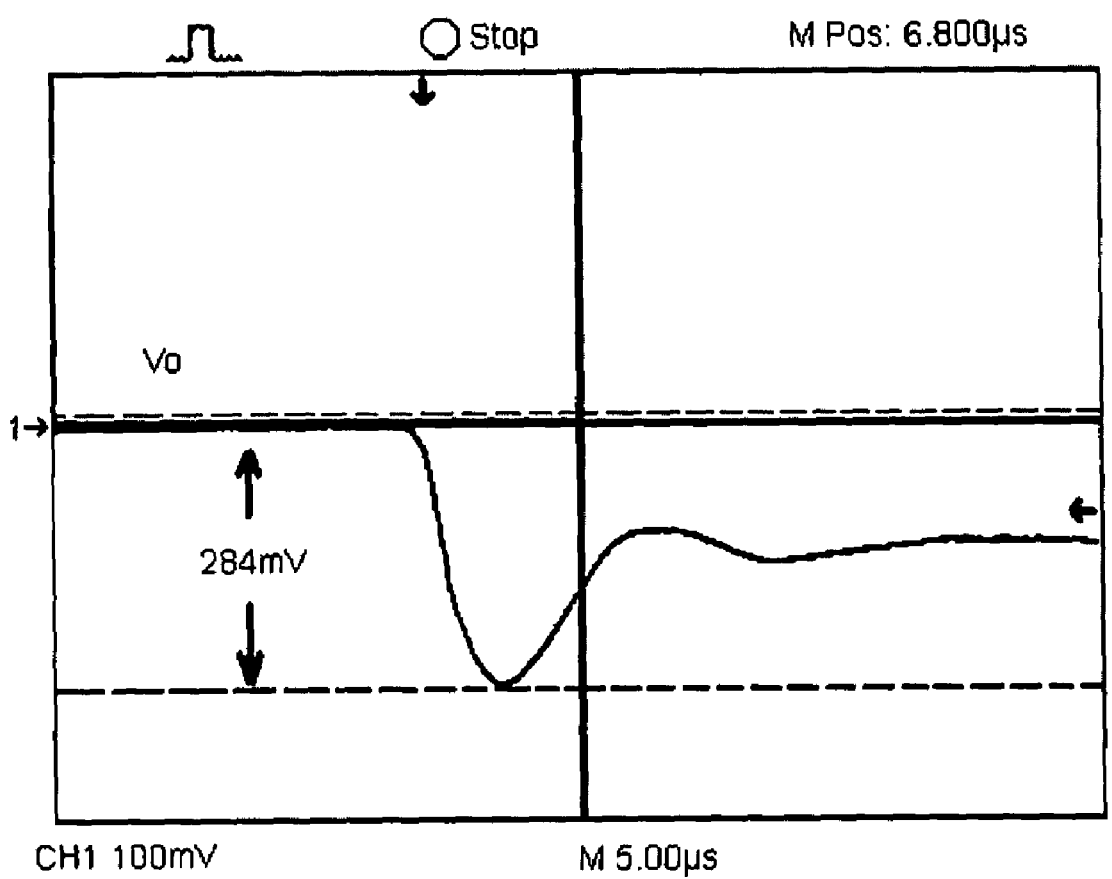
FIG. 11 is a waveform showing the output transient in step up load.
Figure 12:
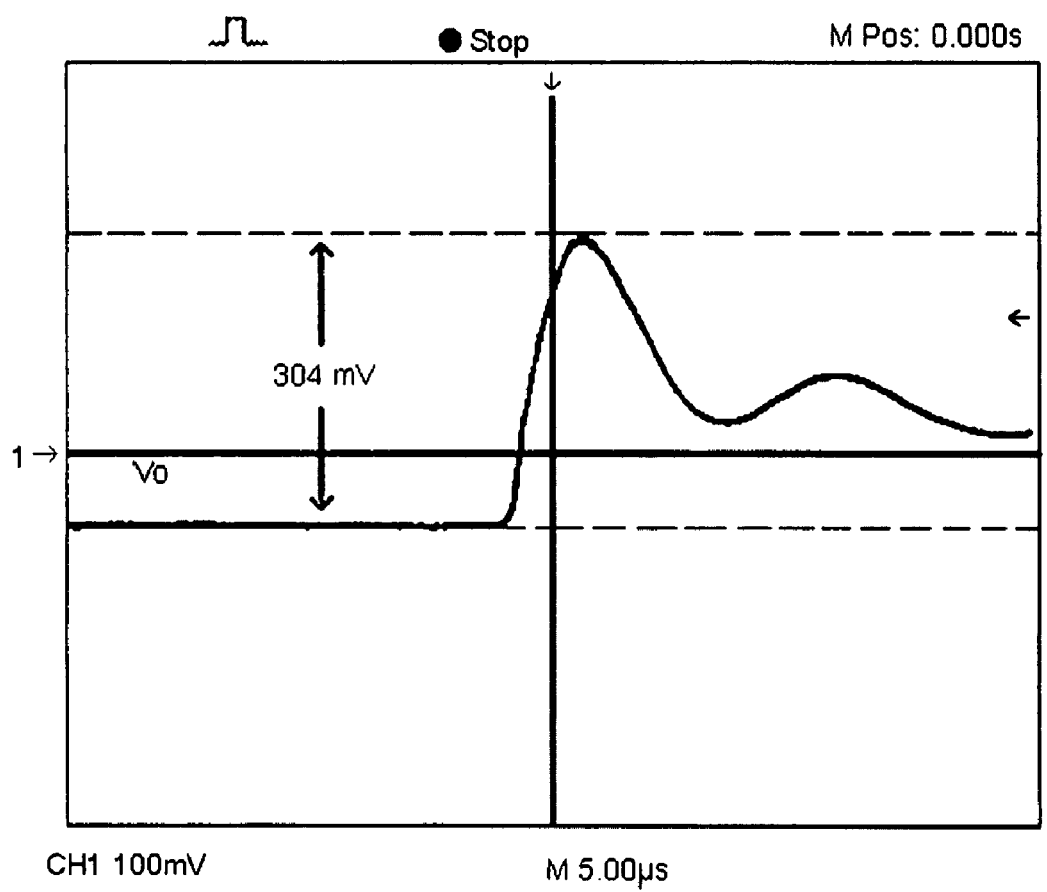
FIG. 12 is a waveform showing the output transient in step down load.

FIG. 11 shows the output transient waveforms in step up load only in 2-CH VRM without active transient voltage compensator. There is 284 mV voltage drop in step up current from 0 A to 30 A. Conversely, FIG. 12 shows the output transient waveforms in step down load only in 2-CH VRM. There is an approximately 304 mV voltage overshoot with in step down current from 30 A to 0 A.

Figure 13:
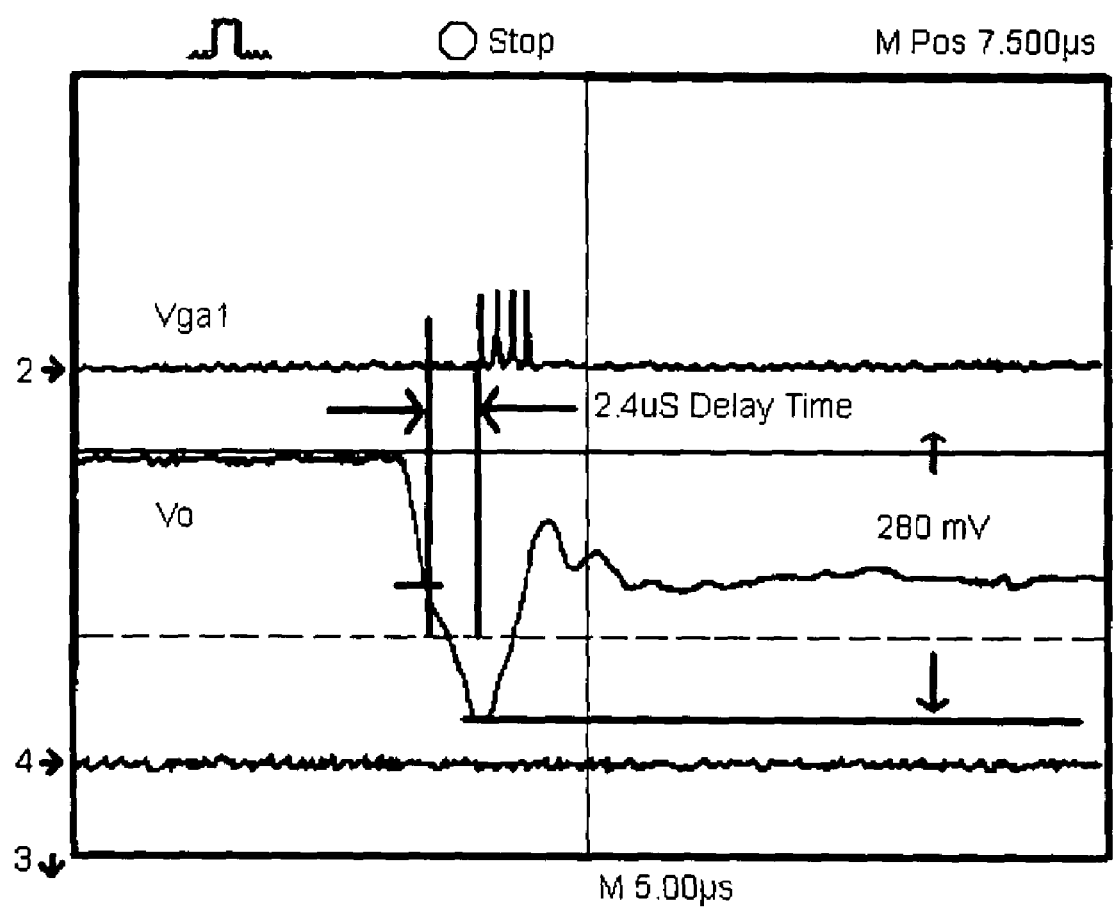
FIG. 13 is a waveform showing the transient with combination of linear and non-linear control in step up load according to the present invention.

FIG. 13 shows the transient waveforms in step up current from 0 A to 30 A with combination of linear and non-linear control in 2-CH VRM with active voltage transient control. It is clear that approximately 2.4 us delay time and 280 mV voltage drop, only small improvement 4 mV achieved because of 2.4 uS the delay time.

Figure 14:
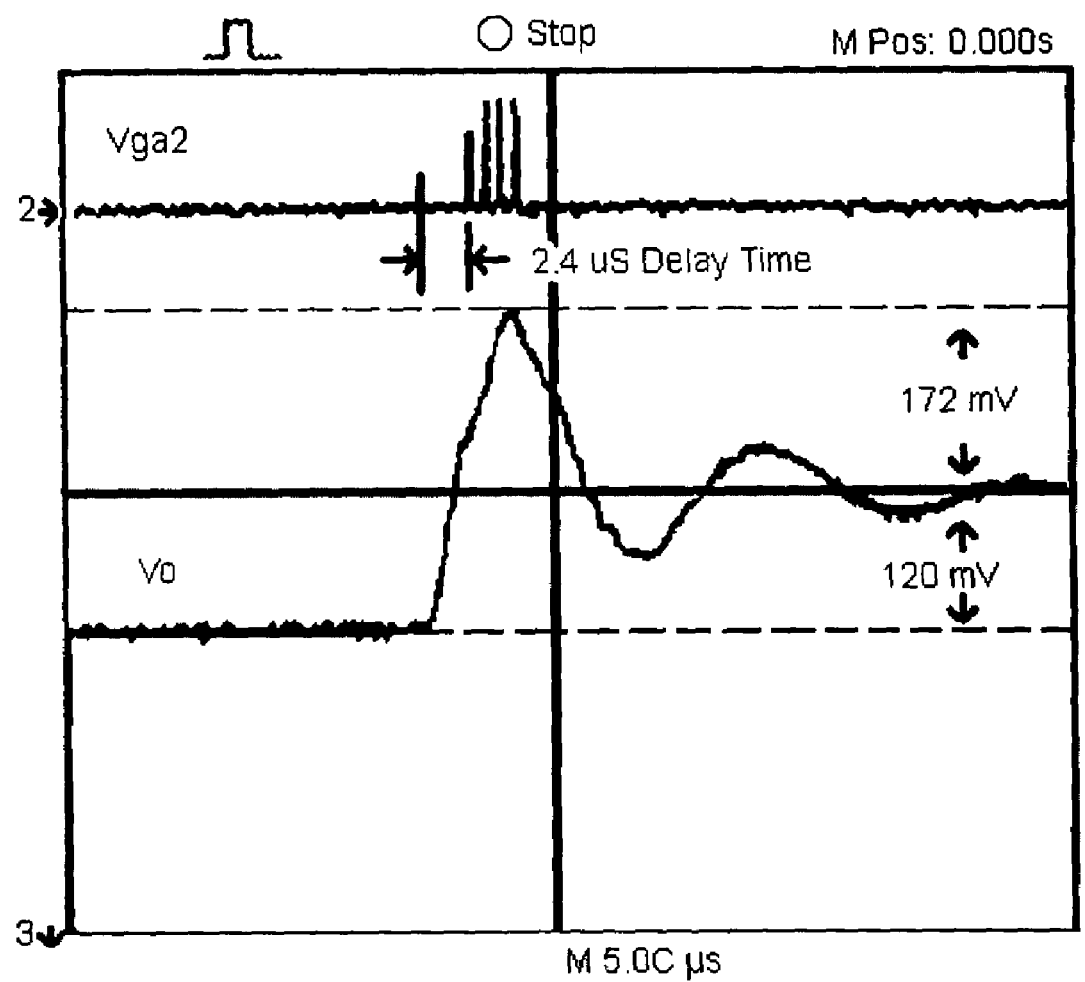
FIG. 14 is a waveform showing the transient with combination of linear and non-linear control in step down load according to the present invention.
Figure 15:
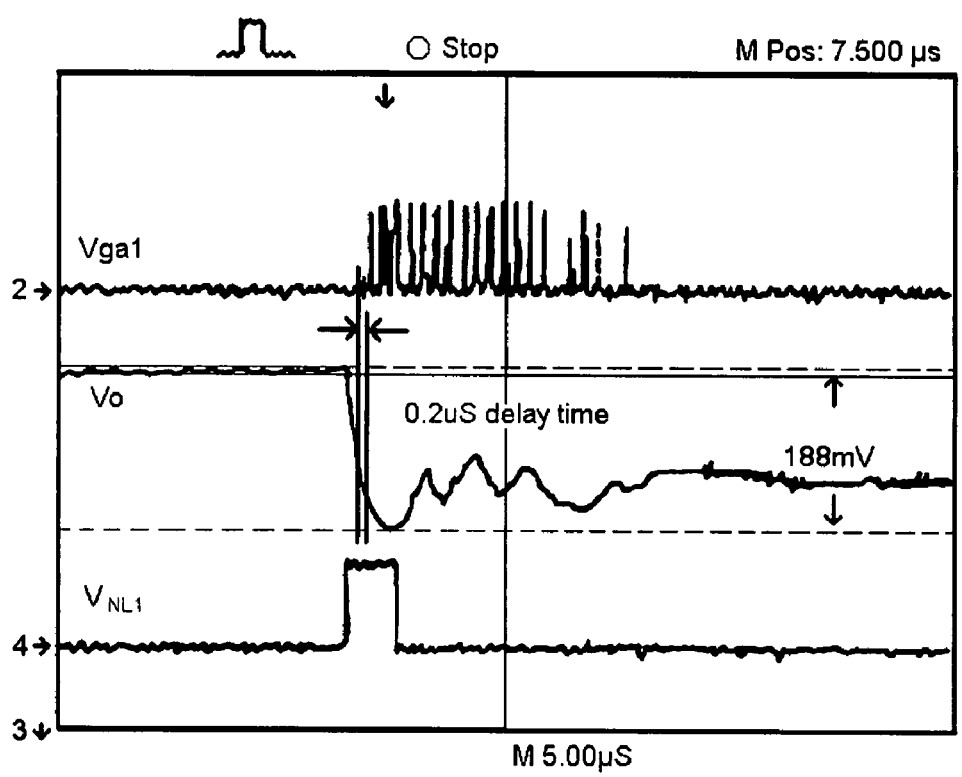
FIG. 15 is a waveform showing the transient with combination of linear and adaptive non-linear control in step up load according to the present invention.

FIG. 14 shows the transient waveforms in step down current from 30 A to 0 A with combination of linear and non-linear control. There is 292 mV voltage overshoot, only small improvement of approximately 12 mV achieved because of the delay time. FIG. 15 shows the transient waveforms in step up current from 0 A to 30 A with combination of linear and adaptive non-linear control. There is only an approximately 0.2 µs delay time and the voltage drop is reduced to approximately 188 mV, an approximately 33.4% improvement is achieved.

Figure 16:
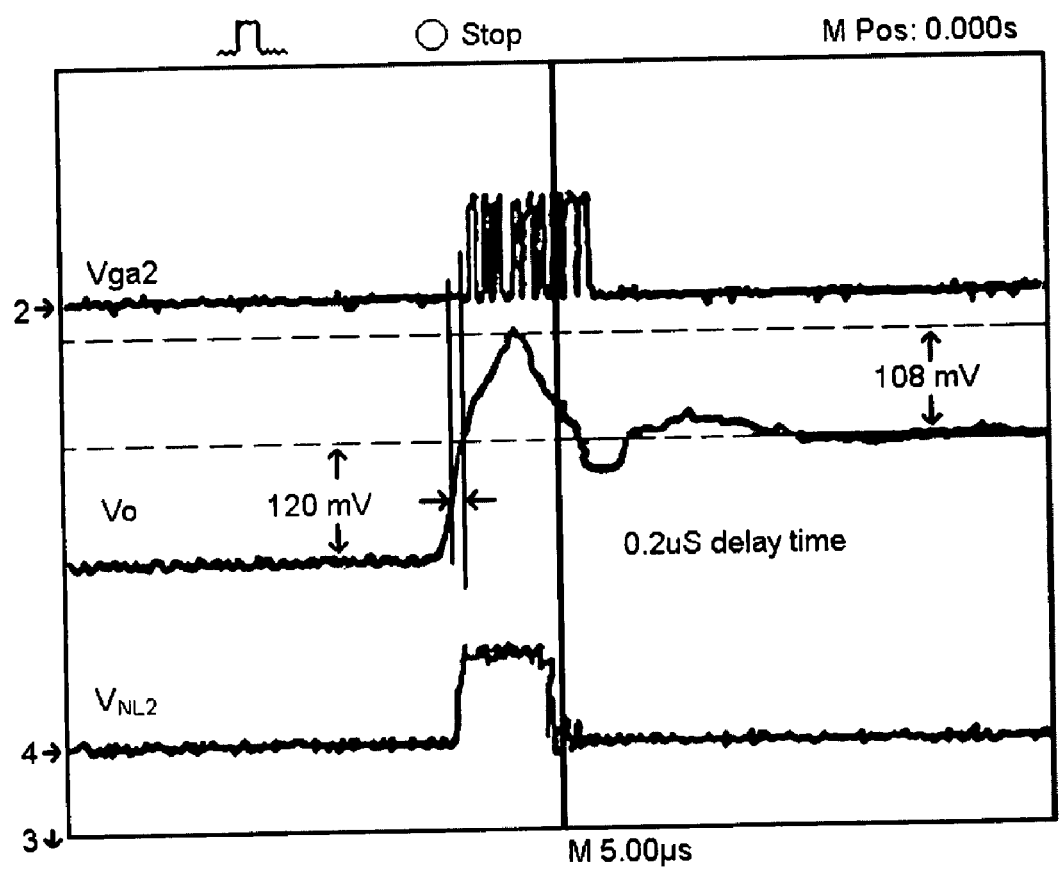
FIG. 16 is a waveform showing the transient with combination of linear and adaptive non-linear control in step down load according to the present invention.

FIG. 16 shows the transient waveforms in step down current from 30 A to 0 A with combination of linear and adaptive non-linear control. There is only 0.2 µs delay time and the voltage overshoot is reduced to approximately 228 mV, an approximately 25% improvement achieved.

In summary, the present invention provides a new method, system, apparatus and device for a high current slew rate, high power density and high efficiency isolated or non-isolated dc-dc converter. The converter transient response is mainly determined by the filter inductance, dv/dt and delay time of error amplifier compensation network. The filter inductance is always designed by the switching frequency and its related power losses. With the increasing demand for better dynamic performance under high slew rate output current, smaller delay time of EA compensation network is required to improve the transient response. A combination of linear and adaptive non-linear control is used to reduce the delay time of compensation network for fast transient response with common requirement of EA.

While the invention has been described, disclosed, illustrated and shown in various terms of certain embodiments or modifications which it has presumed in practice, the scope of the invention is not intended to be, nor should it be deemed to be, limited thereby and such other modifications or embodiments as may be suggested by the teachings herein are particularly reserved especially as they fall within the breadth and scope of the claims here appended.

We claim:

1. A controller for fast transient response comprising:
    a first linear compensation circuit for receiving a load voltage and generating a linear output voltage during steady state operation; and
    a step up non-linear control circuit connected in parallel with the linear compensation circuit for comparing a load voltage to a step up reference voltage to generate a step up non-linear signal when the load voltage is less than the step up reference voltage;
    a step down non-linear control circuit connected in parallel with the linear compensation circuit for comparing a load voltage to a step down reference voltage to generate a step down non-linear signal when the load voltage is greater than the step up reference voltage; and
    an error amplifier and pulse width modulator for comparing the load voltage to a reference voltage to detect a transient period and summing the step up signal with the linear output, wherein only a first impulse of the step up non-linear signal is summed with the linear output during step up transient periods and subtracting the step down non-linear signal from the linear output by a second one shot circuit, wherein only a first pulse of the step down non-linear signal is subtracted from the linear output during step down transient periods, wherein the combination linear and non-linear control provides stability and reduces delay times for fast transient response.

2. The controller of claim 1, further comprising
    an adaptive circuit connected with an input of the non-linear control circuit for receiving a load current and generating a current signal dependent on the load current, wherein the current signal is combined with the output voltage to further reduce a difference between the reference voltage and the output voltage input into the non-linear control circuit.

3. The controller of claim 2, wherein the adaptive circuit comprises:
    a filter for receiving a load voltage; and
    a transconductance amplifier serially connected with the filter, wherein the adaptive circuit generates the current signal dependent on the load current.

4. The controller of claim 1, wherein each of the step up and step down non-linear control circuits comprises:
    a comparator for comparing one of a step up reference voltage and a step down reference voltage, respectively, with the load voltage; and
    a one shot circuit connected with an output of the comparator for receiving the non-linear output signal, wherein only a the first pulse of the non-linear output signal is combined with the linear output signal for stability during transient control.

5. The controller of claim 1, wherein the step up non-linear control circuit comprises:
    a step up comparator for comparing a step up reference voltage and a step down reference voltage with the load voltage; and
    a step up one shot circuit connected with an output of the step up comparator for receiving a step up non-linear output signal, wherein only a the first pulse of the step up non-linear output signal is combined with the linear output signal for stability during transient control.

6. The controller of claim 5, wherein the step down non-linear control circuit comprises:
    a step down comparator for comparing a step down reference voltage with the load voltage; and
    a step down one shot circuit connected with an output of the step down comparator for receiving the step down non-linear output signal, wherein only a the first pulse of the step down non-linear output signal is combined with the linear output signal for stability during transient control.

7. The controller of claim 1, further comprising:
    a second linear compensation circuit connected with the step down non-linear control circuit, wherein the first linear compensation network is connected with the step up non-linear control circuit.

8. The controller of claim 7, wherein each of the first and second linear compensation circuits comprises:
    an error amplifier for comparing the load voltage with a reference voltage to produce an error amplifier output signal; and
    a modulation controller for summing the error amplifier output with the first pulse of the non-linear control output during transient periods.

9. A method for fast transient response during transient periods comprising the step of:
    receiving a load voltage;
    generating a linear output during steady state operation for stability;
    comparing the load voltage to a reference voltage to detect a transient period; and
    generating a non-linear output signal during the detected transient period transient operation comprising the steps of:
        summing the non-linear signal with the linear output by a first one shot circuit when the load voltage is less than the reference voltage, wherein only a first pulse of the step up non-linear signal is summed with the linear output during step up transient periods, wherein only a first pulse of the non-linear signal is summed with the linear output during step up transient periods; and
        subtracting the non-linear output signal from the linear output when the load voltage is greater than the reference voltage, wherein only a first pulse of the non-linear signal is subtracted from the linear output during step down transient periods, wherein the combination linear and non-linear control provides stability and reduces delay times for fast transient response.

10. The method of claim 9, further comprising:
receiving a controlled current;
filtering the controlled current; and
amplifying the filtered controlled current, wherein the amplified controlled current is combined with the load voltage to reduce the difference between the load voltage and the reference voltage to reduce a delay time of the non-linear control circuit.

11. The method of claim 9, wherein the comparing step comprises the steps of:
comparing the load voltage to a step up reference voltage;
generating a step up non-linear signal when the load voltage is less than the step up reference voltage;
summing the step up signal with the linear output by a first one shot circuit, wherein only a first pulse of the step up non-linear signal is summed with the linear output during step up transient periods;
comparing the load voltage to a step down reference voltage;
generating a step down non-linear signal when the load voltage is greater than the step down reference voltage; and
subtracting the step down non-linear signal from the linear output by a second one shot circuit, wherein only a first pulse of the step down non-linear signal is subtracted from the linear output during step down transient periods.

12. The method of claim 9, further comprising the step of:
controlling an output of an isolated dc-to-dc converter for fast transient response for a high current slew rate, high power density and high efficiency isolated or non-isolated dc-dc converter.

13. The method of claim 9, further comprising the step of:
controlling an output of a non-isolated dc-to-dc converter for fast transient response for a high current slew rate, high power density and high efficiency non-isolated dc-dc converter 14. A system for fast transient response comprising:
a linear control compensation network for receiving a load voltage and generating a linear output during steady state operation for stability;
a step up non-linear control circuit for comparing the load voltage to a step up reference voltage and generating a step up non-linear signal when the load voltage is less than the step up reference voltage fast transient response during step up load;
a step down non-linear control circuit for comparing the load voltage to a step down reference voltage and generating a step down non-linear signal when the load voltage is greater than the step up reference voltage for fast transient response during step down load; and
an error amplifier and pulse width modulator for comparing the load voltage to a reference voltage to detect a transient period and summing the step up signal with the linear output by a first one shot circuit, wherein only a first pulse of the step up non-linear signal is summed with the linear output during step up transient periods and subtracting the step down non-linear signal from the linear output by a second one shot circuit, wherein only a first pulse of the step down non-linear signal is subtracted from the linear output during step down transient periods, wherein the controller reduces response delay time for fast transient response.

15. A method for fast transient response during transient periods comprising the step of:
receiving a load voltage;
generating a linear output during steady state operation for stability;
comparing the load voltage to a reference voltage to detect a transient period comprising the steps of:
comparing the load voltage to a step up reference voltage;
generating a step up non-linear signal when the load voltage is less than the step up reference voltage;
summing the step up signal with the linear output by a first one shot circuit, wherein only a first pulse of the step up non-linear signal is summed with the linear output during step up transient periods;
comparing the load voltage to a step down reference voltage;
generating a step down non-linear signal when the load voltage is greater than the step down reference voltage; and
subtracting the step down non-linear signal from the linear output by a second one shot circuit, wherein only a first pulse of the step down non-linear signal is subtracted from the linear output during step down transient periods; and
generating a non-linear output signal during the detected transient period transient operation, wherein the combination linear and non-linear control provides stability and reduces delay times for fast transient response.

* * * * *